(12) United States Patent
Nakamura et al.

(10) Patent No.: US 11,451,115 B2
(45) Date of Patent: Sep. 20, 2022

(54) ELECTRIC MOTOR WITH A HEAT TRANSFER COMPONENT, CIRCUIT BOARD AND A VENTILATION FAN

(71) Applicant: Mitsubishi Electric Corporation, Tokyo (JP)

(72) Inventors: Takuya Nakamura, Tokyo (JP); Junji Okada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 341 days.

(21) Appl. No.: 16/627,526

(22) PCT Filed: Jul. 18, 2017

(86) PCT No.: PCT/JP2017/025960
§ 371 (c)(1),
(2) Date: Dec. 30, 2019

(87) PCT Pub. No.: WO2019/016865
PCT Pub. Date: Jan. 24, 2019

(65) Prior Publication Data
US 2020/0136469 A1    Apr. 30, 2020

(51) Int. Cl.
*H02K 9/08* (2006.01)
*H02K 11/33* (2016.01)
(Continued)

(52) U.S. Cl.
CPC .............. *H02K 9/08* (2013.01); *H02K 9/22* (2013.01); *H02K 11/33* (2016.01); *H05K 1/021* (2013.01);
(Continued)

(58) Field of Classification Search
CPC ............................. H05K 1/0204; H05K 1/021
See application file for complete search history.

(56) References Cited

U.S. PATENT DOCUMENTS 4,626,720 A * 12/1986 Fukasaku ............... H02K 9/06
310/227
4,643,653 A * 2/1987 Masaka ............... F04B 17/046
361/717
(Continued)

FOREIGN PATENT DOCUMENTS

EP    1696070 A1    8/2006
GB    2194987 A     3/1988
(Continued)

OTHER PUBLICATIONS

Extended European Search Report dated Jun. 8, 2020 for corresponding European patent application No. 17917933.8, 8 pages.
(Continued)

*Primary Examiner* — Tulsidas G Patel
*Assistant Examiner* — Robert E Mates
(74) *Attorney, Agent, or Firm* — Buchanan Ingersoll & Rooney PC

(57) ABSTRACT

An electric motor includes: a stator having a sleeve shape; a rotor inside the stator; a shaft coupled to the rotor and stretching along a central axis of the stator; a board case on one end side of the stator in a direction along the central axis; a circuit board on an opposite side of the stator with the board case interposed; a heat generating component on a mounting surface, which is opposite to a surface of the circuit board oriented to a side of the stator; a casing that covers a side of the mounting surface; and a heat transfer component between a surface of the casing that faces the circuit board and the heat generating component. The board case is provided with an extension portion that extends toward the circuit board. The heat transfer component is formed with a first engagement portion with which the extension portion engages.

10 Claims, 8 Drawing Sheets

(51) Int. Cl.
  *H02K 9/22* (2006.01)
  *H05K 1/02* (2006.01)
  *H05K 7/20* (2006.01)
(52) U.S. Cl.
  CPC ....... *H05K 1/0204* (2013.01); *H05K 7/20172* (2013.01)

(56) References Cited

U.S. PATENT DOCUMENTS

| | | | | |
|---|---|---|---|---|
| 4,773,829 | A * | 9/1988 | Vettori | F04D 17/16 |
| | | | | 310/68 R |
| 2006/0061997 | A1 * | 3/2006 | Lin | F21V 19/04 |
| | | | | 362/294 |
| 2014/0009016 | A1 | 1/2014 | Seidenbinder et al. | |
| 2017/0222514 | A1 | 8/2017 | Zechalko et al. | |
| 2017/0349206 | A1 * | 12/2017 | Asao | H05K 7/1427 |

FOREIGN PATENT DOCUMENTS

| | | | |
|---|---|---|---|
| JP | 2015144532 A | 8/2015 | |
| WO | 2013161521 A1 | 10/2013 | |
| WO | 2015139831 A1 | 9/2015 | |
| WO | WO-2016132474 A1 * | 8/2016 | ........... B62D 5/0406 |

OTHER PUBLICATIONS

International Search Report (PCT/ISA/210) dated Sep. 19, 2017, by the Japan Patent Office as the International Searching Authority for International Application No. PCT/JP2017/025960.

Written Opinion (PCT/ISA/237) dated Sep. 19, 2017, by the Japan Patent Office as the International Searching Authority for International Application No. PCT/JP2017/025960.

Office Action dated May 7, 2021, issued in corresponding Chinese Patent Application No. 201780091636.3, 13 pages including 6 pages of English translation.

* cited by examiner

ELECTRIC MOTOR WITH A HEAT TRANSFER COMPONENT, CIRCUIT BOARD AND A VENTILATION FAN

FIELD

The present invention relates to an electric motor and a ventilation fan including a circuit board on which a heat generating component is mounted.

BACKGROUND

A direct current (DC) brushless motor, which is an electric motor, includes a stator including an iron core and windings, a rotor disposed inside the stator, a shaft coupled to the rotor, a bearing that rotatably supports the shaft, and a casing that holds the bearing and accommodates the stator. In addition, a circuit board on which an electronic component, which is a heat generating component, is mounted, a board case that fixes the circuit board, and a heat transfer component that transfers heat generated from the electronic component to the casing are provided inside the casing. Patent Literature 1 discloses an electric motor in which a heat transfer component is fixed in a casing using a screw, which is a fixing member.

CITATION LIST

Patent Literature

Patent Literature 1: Japanese Patent Application Laid-open No. 2015-144532

SUMMARY

Technical Problem

However, the above-described electric motor has a problem in that, since the heat transfer component is fixed using a screw, which is a fixing member, a rise in the number of components and a rise in the number of assembly processes are caused. In addition, since the fixing member is attached from the outside of the casing, there is a problem that the fixing member protrudes from the casing and the size of the electric motor increase.

The present invention has been made in view of the above problems, and an object thereof is to obtain an electric motor capable of fixing a heat transfer component inside a casing, while reducing the number of components, reducing the number of assembly processes, and preventing an increase in the size of the electric motor.

Solution to Problem

In order to solve the above-described problems and achieve the object, an electric motor according to the present invention includes: a stator having a sleeve shape; a rotor disposed inside the stator; and a shaft coupled to the rotor and stretching along a central axis of the stator. In addition, the electric motor according to the present invention includes: a board case provided on one end side of the stator in a direction along the central axis; a circuit board provided on an opposite side of the stator with the board case interposed; a heat generating component provided on a mounting surface, which is an opposite surface to a surface of the circuit board oriented to a side of the stator; a casing that covers a side of the mounting surface; and a heat transfer component provided between a facing surface of the casing that faces the circuit board and the heat generating component. The board case is provided with an extension portion that extends toward the circuit board and protrudes toward a side of the facing surface farther from the circuit board. The heat transfer component is characterized in that a first engagement portion with which the extension portion engages is formed.

Advantageous Effects of Invention

The electric motor according to the present invention has an effect that a heat transfer component can be fixed inside the casing while the number of components is reduced and the size of the electric motor is shrunk.

DESCRIPTION OF EMBODIMENTS

Hereinafter, an electric motor and a ventilation fan according to an embodiment of the present invention will be described in detail with reference to the drawings. Note that this invention is not limited by these embodiments.

First Embodiment

Figure 1:
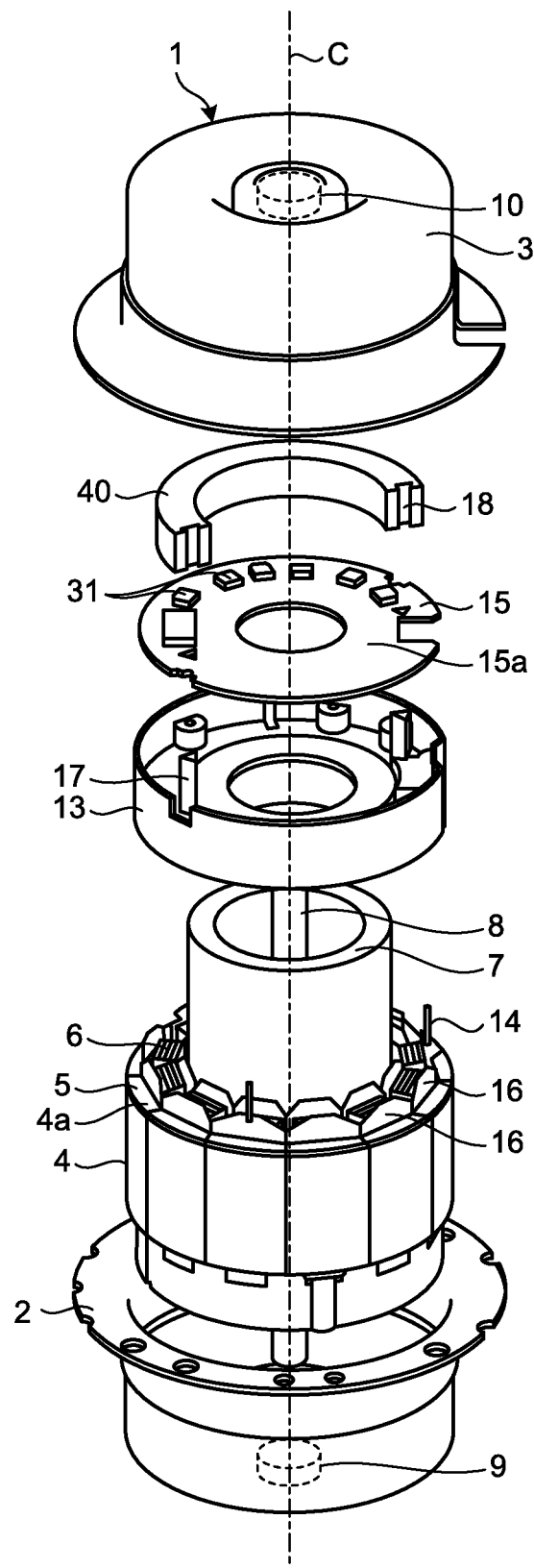
FIG. 1 is a development view of a DC brushless motor, which is an electric motor according to a first embodiment of the present invention.

FIG. 1 is a development view of a DC brushless motor, which is an electric motor according to a first embodiment of the present invention. In the DC brushless motor 1, which is an electric motor, each element is housed inside a casing constituted by a frame 2 and a bracket 3. The frame 2 has a bottomed cylindrical shape and is made of metal. A stator 4 having a sleeve shape is press-fitted inside the frame 2. The stator 4 is configured by winding a coil 6 around an iron core 5 via an insulator 16. The stator 4 is provided with an output pin 14.

A rotor 7 having an annular shape is disposed inside the stator 4. A shaft 8 stretching along a central axis C of the stator 4 is coupled to the rotor 7. One end side of the shaft 8 protrudes outside the frame 2.

In the shaft 8, a second bearing 9 is provided closer to the side of the frame 2 than a coupling portion with the rotor 7, and a first bearing 10 is provided closer to the side of the bracket 3 than the coupling portion with the rotor 7. Each of the bearings 9 and 10 holds the shaft 8 rotatably about the central axis C. The second bearing 9 is held in a housing formed in the frame 2. The first bearing 10 is held in a housing formed in the bracket 3.

Figure 2:
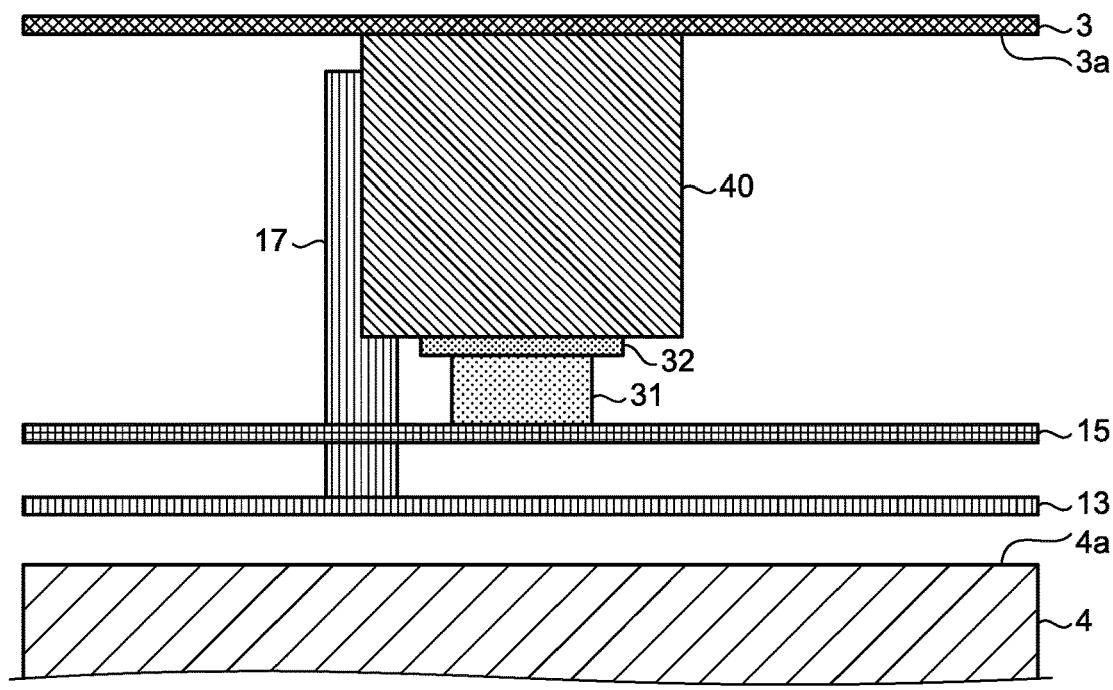
FIG. 2 is a diagram schematically illustrating a cross-sectional configuration of a portion between a stator and a bracket in the first embodiment.

A board case 13 is fixed to the side of one end 4a of the stator 4 in a direction along the central axis C. FIG. 2 is a diagram schematically illustrating a cross-sectional configuration of a portion between the stator 4 and the bracket 3 in the first embodiment. A circuit board 15 is provided on an opposite side of the stator 4 with the board case 13 interposed.

Figure 3:
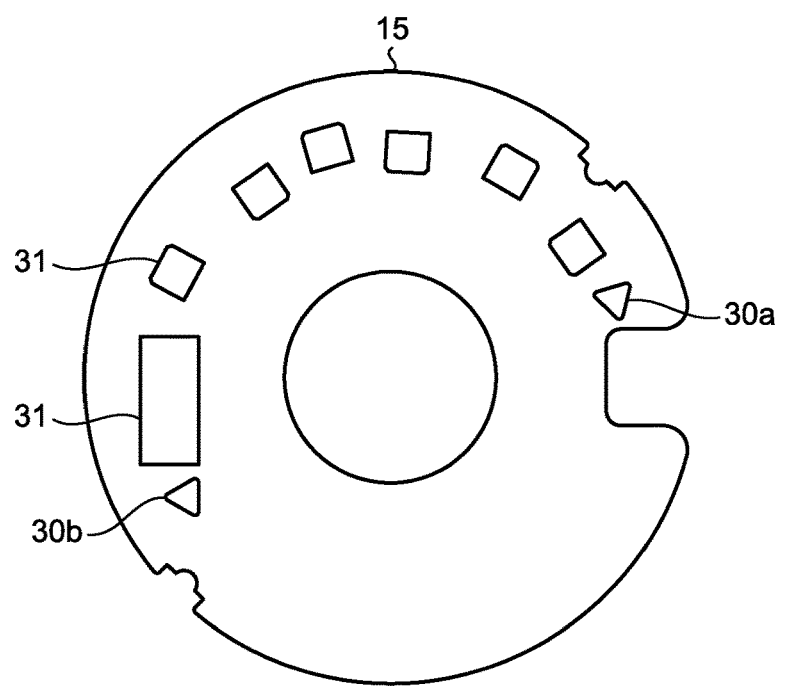
FIG. 3 is a diagram of a circuit board in the first embodiment as viewed from a mounting surface side.

FIG. 3 is a diagram of the circuit board 15 in the first embodiment as viewed from the side of a mounting surface 15a. An electronic component 31, which is a heat generating component, is mounted on the mounting surface 15a, which is a surface of the circuit board 15 opposite to a surface oriented to the side of the stator 4. The electronic component 31 constitutes the function of a drive unit, a control unit, or a power supply unit. The drive unit is exemplified by a configuration using a three-phase bridge driver in which six discrete elements of a one-chip inverter integrated circuit (IC) or an insulated gate bipolar transistor (IGBT) are combined with a motor driver IC. In addition, the control unit is exemplified by a configuration using a microcomputer or a programmable logic controller (PLC).

Returning to FIG. 1, the output pin 14 of the stator 4 passes through a through-hole (not illustrated) formed in the board case 13 and protrudes toward the side of the mounting surface 15a of the circuit board 15 farther from the board case 13. The output pin 14 is electroconductively connected to the circuit board 15 by soldering or the like.

Figure 4:
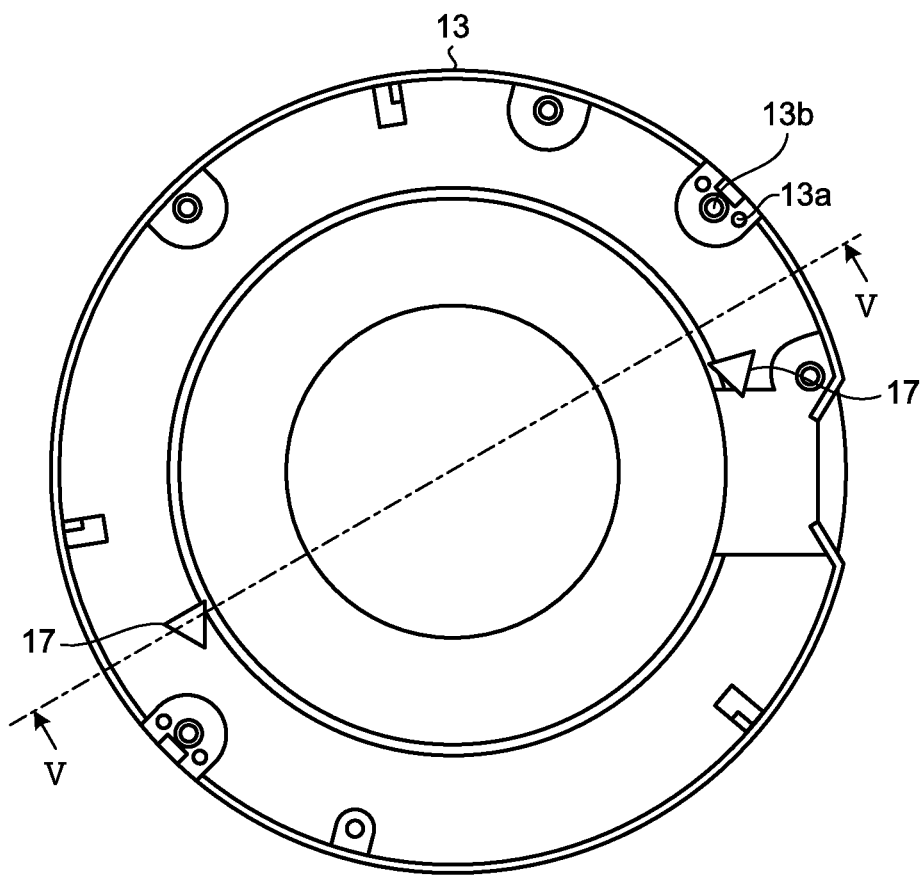
FIG. 4 is a plan view of a board case in the first embodiment.
Figure 5:
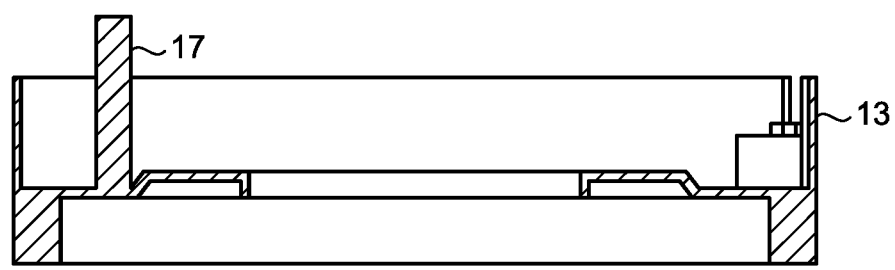
FIG. 5 is a cross-sectional view taken along line V-V illustrated in FIG. 4.

FIG. 4 is a plan view of the board case 13 in the first embodiment. FIG. 5 is a cross-sectional view taken along line V-V illustrated in FIG. 4. The board case 13 is provided with a projection 13a that positions the circuit board 15. In addition, a pilot hole 13b for a screw is formed in the board case 13. The circuit board 15 positioned by the projection 13a is fixed by screwing a screw into the pilot hole 13b, whereby the circuit board 15 is fixed and positioned to the board case 13.

The board case 13 is provided with an extension portion 17 that extends toward the circuit board 15. The extension portions 17 pass through through-holes 30a and 30b formed in the circuit board 15. The first embodiment illustrates an example in which two extension portions 17 are provided, but three or more extension portions 17 may be provided. The extension portion 17 is formed with a length for protruding toward a side of a facing surface 3a farther from the circuit board 15. The facing surface 3a is a surface of the bracket 3 that faces the mounting surface 15a of the circuit board 15. The shape of the extension portion 17 is a triangular prism shape. The extension portion 17 is formed of an insulating material, for example, a resin.

As illustrated in FIG. 2, a heat transfer component 40 is provided between the facing surface 3a of the bracket 3 and the electronic component 31. The heat transfer component 40 transfers heat generated in the electronic component 31 to the bracket 3. The heat transfer component 40 is made of, for example, metal.

Figure 6:
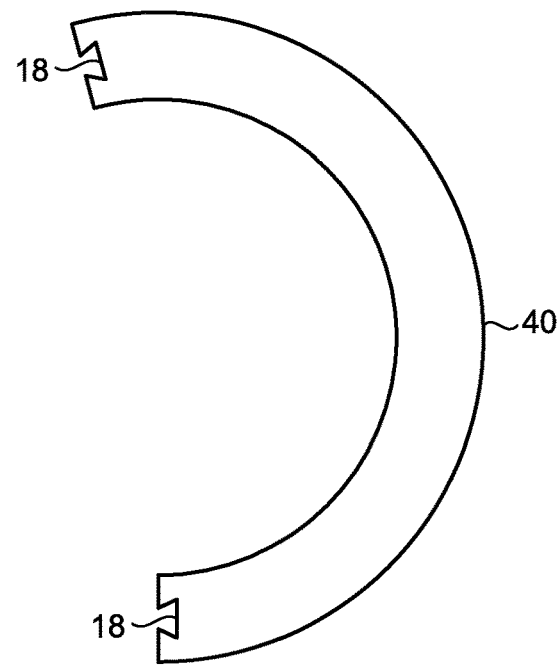
FIG. 6 is a plan view of a heat transfer component in the first embodiment.

FIG. 6 is a plan view of the heat transfer component 40 in the first embodiment. The heat transfer component 40 is formed with a first engagement portion 18 in which the extension portion 17 is inserted and engaged. In the first embodiment, the first engagement portion 18 is a groove stretching in a direction along the central axis C. In addition, the first engagement portion 18 is a trapezoidal groove as viewed in plan, and accommodates two apexes of the extension portion 17 having a triangular shape as viewed in plan, in the groove. With this configuration, the movement of the heat transfer component 40 in a direction perpendicular to the central axis C can be restricted and the heat transfer component 40 can be fixed more reliably.

As illustrated in FIG. 2, a heat dissipation sheet 32 is disposed between the heat transfer component 40 and the electronic component 31. The heat dissipation sheet 32 is constituted of a substance having heat dissipation properties and elasticity. The heat dissipation sheet 32 is sandwiched between the heat transfer component 40 and the electronic component 31 and compressed, such that movement in a direction perpendicular to the central axis C is restricted. The heat dissipation sheet 32 has adhesiveness in some cases. Examples of the heat dissipation sheet 32 include a silicone gel having excellent thermal conductivity.

As described above, the heat transfer component 40 can be fixed using the extension portion 17 formed in the board case 13 without using a screw, such that an assembly process such as fastening the screw can be reduced. In addition, since no screws are used to fix the heat transfer component 40, the number of components can be reduced. Furthermore, since the extension portion 17 that fixes the heat transfer component 40 is provided inside the casing, an increase in the size of the DC brushless motor 1 can be suppressed.

Moreover, since the extension portion 17 that passes through the circuit board 15 is formed of an insulating material, it is not necessary to provide a region for maintaining an insulating distance with the extension portion 17 in the circuit board 15. Therefore, a decrease in the implementation area of the circuit board 15 can be suppressed as compared with a case where the circuit board 15 is fixed using a metal screw.

Figure 7:
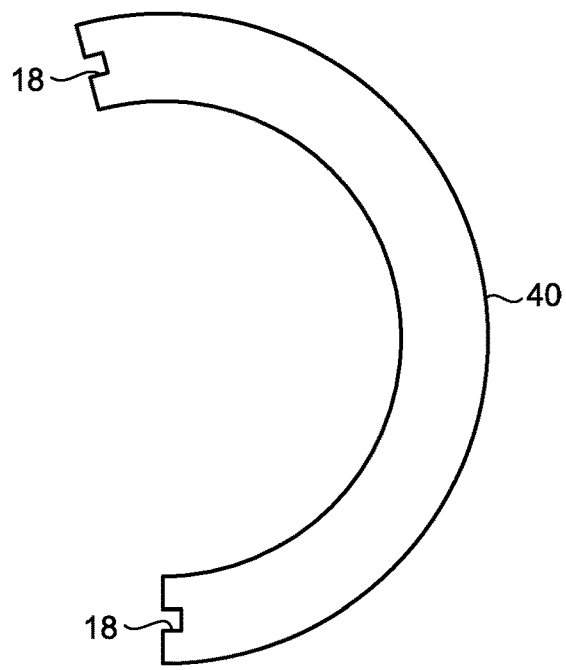
FIG. 7 is a diagram illustrating a first modification of the heat transfer component in the first embodiment.

FIG. 7 is a diagram illustrating a first modification of the heat transfer component 40 in the first embodiment. As illustrated in FIG. 7, the shape of the first engagement portion 18 as viewed in plan may be a rectangular shape. In this case, the shape of the extension portion 17 engaged with the first engagement portion 18 is a quadrangular prism shape.

Figure 8:
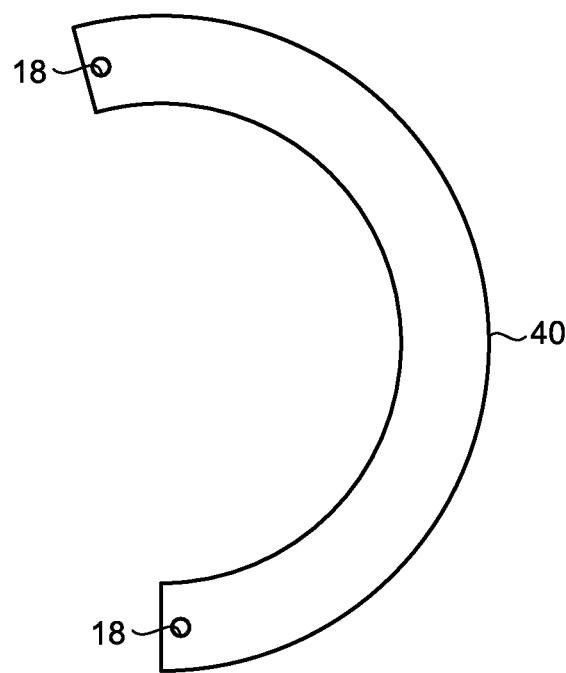
FIG. 8 is a diagram illustrating a second modification of the heat transfer component in the first embodiment.

FIG. 8 is a diagram illustrating a second modification of the heat transfer component 40 in the first embodiment. As illustrated in FIG. 8, the first engagement portion 18 as viewed in plan may be a hole having a circular shape. In this case, the shape of the extension portion 17 engaged with the first engagement portion 18 is a columnar shape. Note that the shape of the hole is not limited to a circular shape.

Figure 9:
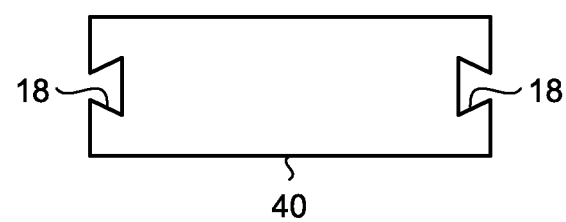
FIG. 9 is a diagram illustrating a third modification of the heat transfer component in the first embodiment.

FIG. 9 is a diagram illustrating a third modification of the heat transfer component 40 in the first embodiment. Depending on the shape of the bracket 3, the shape of the heat transfer component 40 as viewed in plan may be a rectangular shape as illustrated in FIG. 9 instead of an arc shape.

Note that, when an external power supply is supplied to the power supply unit, the DC brushless motor 1 generates a driving torque for rotating the rotor 7 whose load is connected to the shaft 8, by causing the drive unit to energize and drive the coil 6 in response to a control command from the control unit.

Second Embodiment

Figure 10:
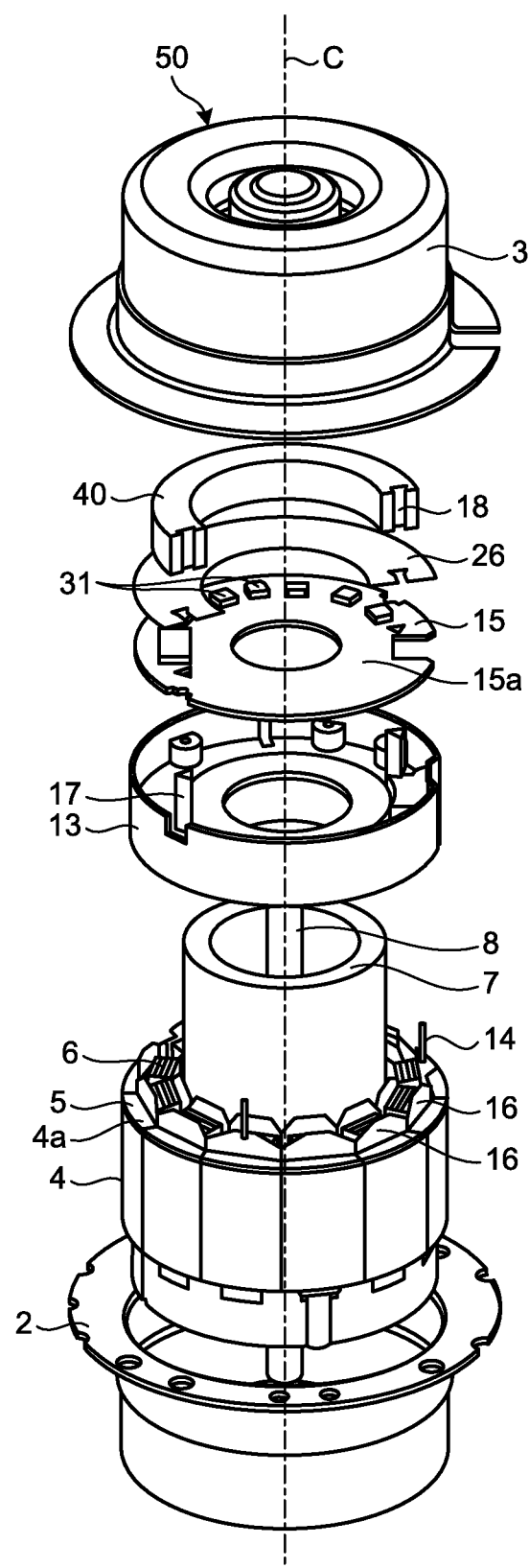
FIG. 10 is a development view of a DC brushless motor according to a second embodiment of the present invention.
Figure 11:
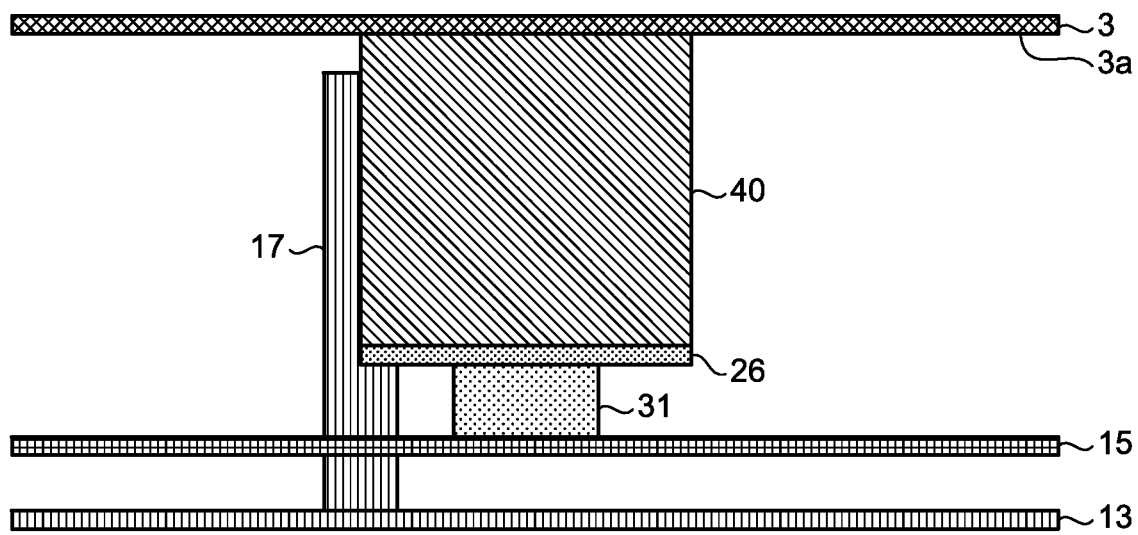
FIG. 11 is a diagram schematically illustrating a cross-sectional configuration of a portion between the stator and the bracket in the second embodiment.

FIG. 10 is a development view of a DC brushless motor 50 according to a second embodiment of the present invention. FIG. 11 is a diagram schematically illustrating a cross-sectional configuration of a portion between the stator 4 and the bracket 3 in the second embodiment. Note that the same constituent members as those in the first embodiment described above are denoted by the same reference numerals and detailed description thereof will be omitted.

In the second embodiment, an insulation component 26 is sandwiched between the heat transfer component 40 and the electronic component 31. The insulation component 26 is formed of an insulating material and insulates the heat transfer component 40 and the electronic component 31 from each other.

The insulation component 26 does not have elasticity and adhesiveness as compared with the heat dissipation sheet 32 illustrated in the first embodiment described above, and is sometimes not sufficiently fixed only by being sandwiched between the heat transfer component 40 and the electronic component 31. Meanwhile, the insulation component 26 is more excellent in electrical insulation properties than the heat dissipation sheet 32 illustrated in the above first embodiment. Examples of the insulation component 26 include a polyester film or a silicone rubber having excellent thermal conductivity.

Figure 12:
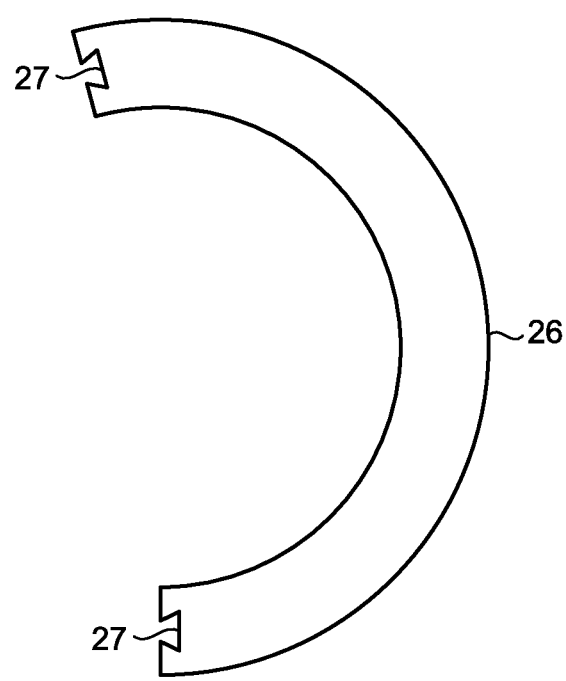
FIG. 12 is a plan view of an insulation component in the second embodiment.

FIG. 12 is a plan view of the insulation component 26 in the second embodiment. The insulation component 26 is formed with a second engagement portion 27 that engages with the extension portion 17. Similarly to the heat transfer component 40 in which the first engagement portion 18 is formed, the insulation component 26 can be fixed to the board case 13 by engaging the second engagement portion 27 with the extension portion 17.

With this configuration, the insulation component 26 can be fixed using the extension portion 17 formed in the board case 13 without using a screw, such that an assembly process such as fastening the screw can be reduced. In addition, since no screws are used to fix the insulation component 26, the number of components can be reduced. Furthermore, since the extension portion 17 that fixes the insulation component 26 is provided inside the casing, an increase in the size of the DC brushless motor 50 can be suppressed.

Note that, similarly to the heat transfer component 40, the shape of the insulation component 26 as viewed in plan and the shape of the second engagement portion 27 can be modified as appropriate.

Figure 13:
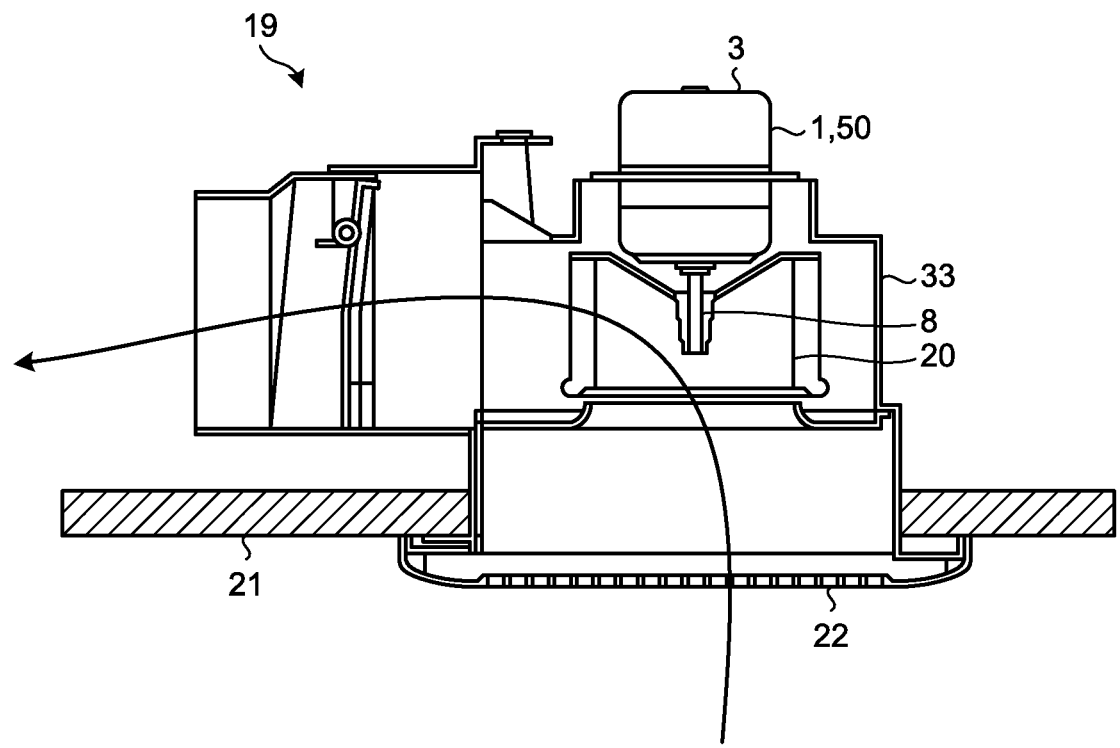
FIG. 13 is a cross-sectional view of a ventilation fan mounted with the DC brushless motor according to the first embodiment or the DC brushless motor according to the second embodiment.

FIG. 13 is a cross-sectional view of a ventilation fan 19 mounted with the DC brushless motor 1 according to the first embodiment or the DC brushless motor 50 according to the second embodiment. The DC brushless motor 1 or the DC brushless motor 50 is mounted on a casing 33 of the ventilation fan 19, and a blower fan 20 is attached to the shaft 8. After the casing 33 is embedded and installed in a ceiling plate 21, a grill 22 is attached from below.

When the DC brushless motor 1 is energized and driven, a driving torque is generated and the blower fan 20 is rotated. When the blower fan 20 rotates, an air flow indicated by an arrow in FIG. 13 is generated.

As illustrated in FIG. 13, the bracket 3 of the DC brushless motors 1 and 50 protrudes outside the casing 33 of the ventilation fan 19, and thus an increase in the size of the DC brushless motors 1 and 50 leads to an increase in the size of the ventilation fan 19. As described above, since an increase in the size of the DC brushless motors 1 and 50 can be suppressed, the ventilation fan 19 can be downsized. Accordingly, it becomes easier to install the ventilation fan 19 in a ceiling cavity or the like where the space is limited.

The configuration illustrated in the above embodiments indicates examples of the content of the present invention and can be combined with another known technology. A part of the configuration can also be omitted and modified without departing from the gist of the present invention.

REFERENCE SIGNS LIST

1, 50 DC brushless motor; 2 frame; 3 bracket; 3a facing surface; 4 stator; 4a one end; 5 iron core; 6 coil; 7 rotor; 8 shaft; 9 second bearing; 10 first bearing; 13 board case; 14 output pin; 15 circuit board; 15a mounting surface; 16 insulator; 17 extension portion; 18 first engagement portion; 19 ventilation fan; 20 blower fan; 21 ceiling plate; 22 grill; 26 insulation component; 27 second engagement portion; 30a, 30b through-hole; 31 electronic component; 32 heat dissipation sheet; 33 casing; 40 heat transfer component.

The invention claimed is:

1. An electric motor comprising:
   a stator having a sleeve shape;
   a rotor disposed inside the stator;
   a shaft coupled to the rotor and stretching along a central axis of the stator;
   a board case provided on one end side of the stator in a direction along the central axis;
   a circuit board provided on an opposite side of the stator with the board case interposed;
   a heat generating component provided on a mounting surface, which is an opposite surface to a surface of the circuit board oriented to a side of the stator;
   a casing to cover a side of the mounting surface;
   a heat transfer component provided between a facing surface of the casing that faces the circuit board and the heat generating component, wherein
   the board case is provided with an extension portion that extends toward the circuit board and protrudes toward a side of the facing surface farther from the circuit board, and
   the heat transfer component is formed with a first engagement portion with which the extension portion engages; and
   an insulation component provided between the heat transfer component and the heat generating component, wherein
   the insulation component is formed with a second engagement portion with which the extension portion engages.

2. The electric motor according to claim 1, wherein the circuit board is formed with a through-hole through which the extension portion passes.

3. The electric motor according to claim 2, wherein
   the board case is formed with a projection portion that protrudes toward a side of the circuit board and supports the circuit board, and
   a pilot hole for a screw is formed for the projection portion.

4. A ventilation fan comprising:
   the electric motor according to claim 3; and
   a blower fan coupled to the shaft of the electric motor.

5. A ventilation fan comprising:
   the electric motor according to claim 2; and
   a blower fan coupled to the shaft of the electric motor.

6. The electric motor according to claim 1, wherein
the board case is formed with a projection portion that protrudes toward a side of the circuit board and supports the circuit board, and
a pilot hole for a screw is formed for the projection portion.

7. A ventilation fan comprising:
the electric motor according to claim 6; and
a blower fan coupled to the shaft of the electric motor.

8. A ventilation fan comprising:
the electric motor according to claim 1; and
a blower fan coupled to the shaft of the electric motor.

9. The electric motor according to claim 1, wherein the extension portion is formed from an insulating material.

10. The electric motor according to claim 1, wherein the first engagement portion is arranged at a peripheral surface of the heat transfer component.

* * * * *